(12) United States Patent
Sakamaki et al.

(10) Patent No.: US 12,273,965 B2
(45) Date of Patent: Apr. 8, 2025

(54) HOLDING DEVICE AND METHOD OF MANUFACTURING HOLDING DEVICE

(71) Applicant: NGK SPARK PLUG CO., LTD., Nagoya (JP)

(72) Inventors: Ryunosuke Sakamaki, Nagoya (JP); Katsuya Takaoka, Nagoya (JP); Hiroshi Watanabe, Nagoya (JP)

(73) Assignee: Niterra Co., Ltd., Nagoya (JP)

( * ) Notice: Subject to any disclaimer, the term of this patent is extended or adjusted under 35 U.S.C. 154(b) by 708 days.

(21) Appl. No.: 16/975,527

(22) PCT Filed: Nov. 13, 2019

(86) PCT No.: PCT/JP2019/044467
§ 371 (c)(1),
(2) Date: Aug. 25, 2020

(87) PCT Pub. No.: WO2020/105522
PCT Pub. Date: May 28, 2020

(65) Prior Publication Data
US 2021/0037613 A1  Feb. 4, 2021

(30) Foreign Application Priority Data

Nov. 19, 2018 (JP) .................................. 2018-216115
Nov. 19, 2018 (JP) .................................. 2018-216116

(51) Int. Cl.
*H05B 3/12* (2006.01)
*C04B 35/581* (2006.01)
(Continued)

(52) U.S. Cl.
CPC ............. *H05B 3/12* (2013.01); *C04B 35/581* (2013.01); *H01L 21/68757* (2013.01);
(Continued)

(58) Field of Classification Search
CPC ...... C04B 35/581; H01L 21/68; H01L 21/683
See application file for complete search history.

(56) References Cited

U.S. PATENT DOCUMENTS 7,126,090 B2  10/2006  Yamaguchi et al.
7,446,284 B2  11/2008  Fan et al.
(Continued)

FOREIGN PATENT DOCUMENTS

CN  101026119 A  8/2007
CN  107872903 A  4/2018
(Continued)

OTHER PUBLICATIONS

International Search Report for PCT/JP2019/044467 dated Jan. 7, 2020 (PCT/ISA/210).
(Continued)

*Primary Examiner* — John J Norton
*Assistant Examiner* — Theodore J Evangelista
(74) *Attorney, Agent, or Firm* — Sughrue Mion, PLLC

(57) ABSTRACT

A holding device including a ceramic member formed of a sintered ceramic material containing aluminum nitride as a main component, a heating resistor element formed of a metal and disposed in the ceramic member, an electrically conductive electricity supply connection member in contact with the heating resistor element, and an electrically conductive electricity supply terminal electrically connected to the electricity supply connection member. The holding device holds an object on the surface of the ceramic member. In the holding device, at least a portion of the surface of the electricity supply connection member, excluding its contact surface for contact with the heating resistor element and its connection surface for connection with the electricity supply terminal, is covered with a coat layer formed of a nitride
(Continued)

containing at least one of Al, Ti, Zr, V, Ta, and Nb. Also disclosed is a method of manufacturing the holding device.

8 Claims, 6 Drawing Sheets

(51) Int. Cl.
| | |
|---|---|
| *H01L 21/67* | (2006.01) |
| *H01L 21/683* | (2006.01) |
| *H01L 21/687* | (2006.01) |
| *H05B 3/03* | (2006.01) |
| *H05B 3/06* | (2006.01) |
| *H05B 3/20* | (2006.01) |
| *H05B 3/28* | (2006.01) |
| *H05B 3/74* | (2006.01) |

(52) U.S. Cl.
CPC ............... *H05B 3/03* (2013.01); *H05B 3/06* (2013.01); *H05B 3/20* (2013.01); *H05B 3/283* (2013.01); *H05B 3/74* (2013.01); *H01L 21/67103* (2013.01); *H01L 21/683* (2013.01); *H05B 2203/016* (2013.01)

(56) References Cited

U.S. PATENT DOCUMENTS

| | | | |
|---|---|---|---|
| 10,626,501 B2 | 4/2020 | Kurano et al. | |
| 2003/0183615 A1 | 10/2003 | Yamaguchi et al. | |
| 2005/0045618 A1 | 3/2005 | Ito | |
| 2005/0194374 A1 | 9/2005 | Gelatos et al. | |
| 2006/0216533 A1 | 9/2006 | Kobayashi et al. | |
| 2007/0138601 A1* | 6/2007 | Fan | H01L 21/67103 |
| | | | 257/632 |
| 2007/0257022 A1* | 11/2007 | Lin | H05B 3/283 |
| | | | 219/443.1 |
| 2009/0283933 A1 | 11/2009 | Kobayashi et al. | |
| 2010/0154203 A1 | 6/2010 | Lin et al. | |
| 2010/0187220 A1 | 7/2010 | Choi et al. | |
| 2010/0244350 A1 | 9/2010 | Fujisato et al. | |
| 2012/0318785 A1* | 12/2012 | Kushihashi | H05B 3/143 |
| | | | 219/548 |
| 2018/0087153 A1 | 3/2018 | Kurano et al. | |
| 2020/0404747 A1 | 12/2020 | Sakamaki et al. | |

FOREIGN PATENT DOCUMENTS

| | | | |
|---|---|---|---|
| JP | S61179084 A | * | 8/1986 |
| JP | H07135068 A | * | 5/1995 |
| JP | 2003-288975 A | | 10/2003 |
| JP | 2006-273586 A | | 10/2006 |
| JP | 3888531 B2 | | 3/2007 |
| JP | 2007273992 A | * | 10/2007 |
| JP | 2016-042457 A | | 3/2016 |
| KR | 101776581 B1 | * | 9/2017 |
| KR | 10-2023-0150707 A | | 10/2023 |
| WO | 2022/072382 A1 | | 4/2022 |

OTHER PUBLICATIONS

Communication issued Oct. 9, 2021 from the China National Intellectual Property Administration in counterpart Chinese Application No. 201980007168.6.
Communication dated Nov. 29, 2021, issued by the State Intellectual Property Office of the P.R.C. in application No. 201980007526.3.
Office Action issued Nov. 24, 2023 in U.S. Appl. No. 16/975,607.
International Search Report for PCT/JP2019/044466 dated Jan. 7, 2020 [PCT/ISA/21 0].
United States Office Action issued Mar. 18, 2024 in U.S. Appl. No. 16/975,607.

* cited by examiner

FIG.5

| Sample No. | Material of electricity receiving electrode 53 | First coat layer 61 of electricity receiving electrode 53 Material | First coat layer 61 of electricity receiving electrode 53 Thickness t1 (μm) | Second coat layer 62 of electricity receiving electrode 53 | Third coat layer 63 of heating resistor element 50 | Variation in temperature of holding surface S1 (@500°C) | After 600°C, 50-hour heat resistance test Coming off of terminal member 70 | After 600°C, 50-hour heat resistance test Cracking of holding member 10 | After 600°C, 100-hour heat resistance test Coming off of terminal member 70 | After 600°C, 100-hour heat resistance test Cracking of holding member 10 |
|---|---|---|---|---|---|---|---|---|---|---|
| SA1 | Mo | ZrN | 0.1 | AlN | — | Δ8°C | Not occurred | Not occurred | Occurred | Not occurred |
| SA2 | W | TiN | 63 | AlN | — | Δ9°C | Not occurred | Not occurred | Occurred | Occurred |
| SA3 | Mo | (Al,Ti)N | 0.4 | AlN | — | Δ7°C | Not occurred | Not occurred | Not occurred | Not occurred |
| SA4 | W | (Al,Cr)N | 0.4 | AlN | — | Δ6°C | Not occurred | Not occurred | Not occurred | Not occurred |
| SA5 | W-Mo | ZrN | 0.3 | AlN | — | Δ7°C | Not occurred | Not occurred | Not occurred | Not occurred |
| SA6 | W-Re | VN | 5 | AlN | — | Δ5°C | Not occurred | Not occurred | Not occurred | Not occurred |
| SA7 | Mo-Re | TiN | 60 | AlN | — | Δ6°C | Not occurred | Not occurred | Not occurred | Not occurred |
| SA8 | Mo | (Ti,Cr)N | 10 | AlN | — | Δ5°C | Not occurred | Not occurred | Not occurred | Not occurred |
| SA9 | Mo | (Al,Ti,Cr)N | 40 | AlN | — | Δ6°C | Not occurred | Not occurred | Not occurred | Not occurred |
| SA10 | Mo | (Al,Ti,Si)N | 25 | AlN | — | Δ6°C | Not occurred | Not occurred | Not occurred | Not occurred |
| SA11 | Mo | TiN | 4 | AlN | AlN | Δ4°C | Not occurred | Not occurred | Not occurred | Not occurred |
| SA12 | Mo | ZrN | 3 | AlN | AlN | Δ3°C | Not occurred | Not occurred | Not occurred | Not occurred |
| SA13 | W | — | — | — | — | Δ12°C | Occurred | Occurred | — | — |
| SA14 | Mo | — | — | — | — | Δ10°C | Occurred | Not occurred | — | — |

FIG.6

| Sample No. | Material of electricity receiving electrode 53 | First coat layer 61 of electricity receiving electrode 53 | | Second coat layer 62 of electricity receiving electrode 53 | Third coat layer 63 of heating resistor element 50 | Variation in temperature of holding surface S1 (@500°C) | After 600°C, 50-hour heat resistance test | | After 600°C, 100-hour heat resistance test | |
|---|---|---|---|---|---|---|---|---|---|---|
| | | Material | Thickness t1(μm) | | | | Coming off of terminal member 70 | Cracking of holding member 10 | Coming off of terminal member 70 | Cracking of holding member 10 |
| SA15 | Mo-Re | ZrN | 0.1 | ZrN | — | ⊿9°C | Not occurred | Not occurred | Occurred | Not occurred |
| SA16 | W | TiN | 62 | TiN | — | ⊿8°C | Not occurred | Not occurred | Occurred | Occurred |
| SA17 | W-Re | — | — | ZrN | — | ⊿8°C | Not occurred | Not occurred | Not occurred | Not occurred |
| SA18 | Mo | TiN | 0.9 | TiN | — | ⊿7°C | Not occurred | Not occurred | Not occurred | Not occurred |
| SA19 | W | TaN | 2 | TaN | — | ⊿6°C | Not occurred | Not occurred | Not occurred | Not occurred |
| SA20 | Mo | ZrN | 0.3 | ZrN | — | ⊿7°C | Not occurred | Not occurred | Not occurred | Not occurred |
| SA21 | W-Mo | VN | 5 | VN | — | ⊿5°C | Not occurred | Not occurred | Not occurred | Not occurred |
| SA22 | W | TiN | 50 | TiN | — | ⊿6°C | Not occurred | Not occurred | Not occurred | Not occurred |
| SA23 | Mo | NbN | 8 | NbN | — | ⊿5°C | Not occurred | Not occurred | Not occurred | Not occurred |
| SA24 | Mo | (Al,Ti,Cr)N | 30 | (Al,Ti,Cr)N | — | ⊿6°C | Not occurred | Not occurred | Not occurred | Not occurred |
| SA25 | Mo | (Al,Ti,Si)N | 15 | (Al,Ti,Si)N | — | ⊿5°C | Not occurred | Not occurred | Not occurred | Not occurred |
| SA26 | Mo | ZrN | 3 | ZrN | ZrN | ⊿3°C | Not occurred | Not occurred | Not occurred | Not occurred |

HOLDING DEVICE AND METHOD OF MANUFACTURING HOLDING DEVICE

CROSS REFERENCE TO RELATED APPLICATIONS

This application is a National Stage of International Application No. PCT/JP2019/044467 filed Nov. 13, 2019, claiming priorities based on Japanese Patent Application No. 2018-216116 filed Nov. 19, 2018 and Japanese Patent Application No. 2018-216115 filed Nov. 19, 2018.

TECHNICAL FIELD

The technique disclosed in the present specification relates to a holding device for holding an object.

BACKGROUND ART

There has been known a heating device (also called a "susceptor") which heats an object (for example, a semiconductor wafer) to a predetermined temperature (for example, about 400 to 800° C.) while holding the object. The heating device is used, for example, as a portion of a semiconductor manufacturing apparatus such as a film formation apparatus (a CVD film formation apparatus, a sputtering film formation apparatus, etc.) or an etching apparatus (a plasma etching apparatus, etc.).

In general, such a heating device includes a ceramic member formed of a sintered ceramic material. A heating resistor element formed of, for example, a metal such as tungsten (W) or molybdenum (Mo) is disposed in the ceramic member. Also, the heating device includes electricity supply connection members which are electrically conductive and are in contact with the heating resistor element, and electricity supply terminals which are electrically conductive and are electrically connected to the electricity supply connection members. When a voltage is applied to the heating resistor element through the electricity supply terminals and the electricity supply connection members, the heating resistor element generates heat, so that an object held on a surface of the ceramic member (hereinafter referred to as the "holding surface") is heated.

When the heating device is manufactured, a compact formed of the material of the ceramic member and including the material of the heating resistor element disposed therein is fired at a high temperature (for example, about 1,700 to 1,900° C.), whereby the ceramic member formed of a dense sintered ceramic material and the heating resistor element disposed in the ceramic member are manufactured. During the firing, an impurity (impurities) (for example, carbon) originating from raw materials or the atmosphere within a furnace may enter the compact of the material of the ceramic member before being densified, and react with the heating resistor element, thereby forming an altered layer (for example, a tungsten carbide layer or a molybdenum carbide layer) on the surface of the heating resistor element. If such an altered layer is formed on the surface of the heating resistor element, a variation (intra-product and/or inter-product variation) in the resistance of the heating resistor element may arise. This may result in occurrence of a variation in the amount of heat generated by the heating resistor element and a variation in the temperature of the holding surface of the ceramic member (and thus, the temperature of the object held on the holding surface). A conventionally known technique for suppressing formation of the altered layer on the surface of the heating resistor element involves adjustment of the relative density and firing conditions of the ceramic member (see, for example, Patent Document 1).

PRIOR ART DOCUMENT

Patent Document

Patent Document 1: JP2006-273586A

SUMMARY OF THE INVENTION

Problem to be Solved by the Invention

In the above-described conventional technique, attention is paid only to the altered layer formed on the surface of the heating resistor element. However, the present inventors have newly found a problem that, during firing of the ceramic member, altered layers may be formed on the surfaces of the electricity supply connection members as a result of reaction of the electricity supply connection members with an impurity (impurities) originating from the raw materials or the atmosphere within the furnace, and the formation of the altered layers may cause a connection failure between the electricity supply connection members and the heating resistor element or between the electricity supply connection members and the electricity supply terminals and/or may cause a variation in the amount of heat generated by the heating resistor element due to a variation in the resistance of each electricity supply connection member.

Notably, such problem is a common problem that occurs not only in the heating device having the above-described structure but also in a holding device which includes a ceramic member formed of a sintered ceramic material, a heating resistor element formed of a metal and disposed in the ceramic member, an electricity supply connection member which is electrically conductive and is in contact with the heating resistor element, and an electricity supply terminal which is electrically conductive and is electrically connected to the electricity supply connection member, and which holds an object on a surface of the ceramic member.

The present specification discloses a technique capable of solving the above-described problem.

Means for Solving the Problem

The technique disclosed in the present specification can be embodied, for example, in the following aspects.

(1) A holding device disclosed in the present specification comprises a ceramic member having a first surface and formed of a sintered ceramic material containing aluminum nitride as a main component; a heating resistor element formed of a metal and disposed in the ceramic member; an electricity supply connection member which is electrically conductive and is in contact with the heating resistor element; and an electricity supply terminal which is electrically conductive and is electrically connected to the electricity supply connection member. The holding device holds an object on the first surface of the ceramic member. In the holding device, at least a portion of a surface of the electricity supply connection member, excluding its contact surface for contact with the heating resistor element and its connection surface for connection with the electricity supply terminal, is covered with a second coat layer formed of a nitride containing at least one of Al, Ti, Zr, V, Ta, and Nb. In the present holding device, by virtue of the presence of the second coat layer covering the surface of the electricity supply connection member, it is possible to suppress formation of an altered layer on the surface of the electricity supply connection member during firing of the ceramic member, which altered layer is formed as a result of the electricity supply connection member reacting with an impurity (impurities). Thus, it is possible to suppress occurrence of a connection failure between the electricity supply connection member and the heating resistor element or between the electricity supply connection member and the electricity supply terminal, and occurrence of a variation in the amount of heat generated by the heating resistor element due to a variation in the resistance of the electricity supply connection member. As a result, it is possible to suppress a variation in the temperature of the first surface of the ceramic member (and thus, the temperature of the object held on the first surface). Also, since the second coat layer is formed of a nitride containing at least one of Al, Ti, Zr, V, Ta, and Nb, during high temperature firing, the second coat layer has heat resistance, and element diffusion into the ceramic member whose main component is aluminum nitride is less likely to occur. Accordingly, in the present holding device, while a change in the characteristics of the ceramic member due to the element diffusion from the second coat layer is suppressed, presence of the second coat layer having high heat resistance makes it possible to suppress formation of an altered layer on the surface of the electricity supply connection member. Thus, it is possible to suppress occurrence of a connection failure between the electricity supply connection member and the heating resistor element or between the electricity supply connection member and the electricity supply terminal, as well as occurrence of a variation in the amount of heat generated by the heating resistor element due to a variation in the resistance of the electricity supply connection member. As a result, it is possible to suppress a variation in the temperature of the first surface of the ceramic member (and thus, the temperature of the object held on the first surface).

(2) The above-described holding device may be configured such that at least a portion of a contact surface, which is a part of the surface of the electricity supply connection member and is for contact with the heating resistor element, is covered with a first coat layer formed of a nitride containing at least one of Ti, Zr, V, Cr, Ta, and Nb. When such a configuration is employed, by virtue of the presence of the first coat layer covering the surface of the electricity supply connection member, it is possible to effectively suppress formation of an altered layer on the surface of the electricity supply connection member during firing of the ceramic member, which altered layer is formed as a result of the electricity supply connection member reacting with an impurity (impurities). Thus, it is possible to suppress occurrence of a connection failure between the electricity supply connection member and the heating resistor element or between the electricity supply connection member and the electricity supply terminal, and occurrence of a variation in the amount of heat generated by the heating resistor element due to a variation in the resistance of the electricity supply connection member. As a result, it is possible to suppress a variation in the temperature of the first surface of the ceramic member (and thus, the temperature of the object held on the first surface). Also, since the first coat layer is formed of a nitride containing at least one of Ti, Zr, V, Cr, Ta, and Nb, during high temperature firing, the first coat layer has heat resistance, and element diffusion into the ceramic member whose main component is aluminum nitride is less likely to occur. Also, since the first coat layer is electrically conductive, the first coat layer can secure electrical connection between the electricity supply connection member and the heating resistor element. Accordingly, in the present holding device, while the first coat layer's hindrance to the electrical connection between the electricity supply connection member and the heating resistor element is avoided and a change in the characteristics of the ceramic member due to the element diffusion from the first coat layer is suppressed, presence of the first coat layer having high heat resistance makes it possible to effectively suppress formation of an altered layer on the surface of the electricity supply connection member. Thus, it is possible to suppress occurrence of a connection failure between the electricity supply connection member and the heating resistor element or between the electricity supply connection member and the electricity supply terminal, and occurrence of a variation in the amount of heat generated by the heating resistor element due to a variation in the resistance of the electricity supply connection member. As a result, it is possible to suppress a variation in the temperature of the first surface of the ceramic member (and thus, the temperature of the object held on the first surface).

(3) In the above-described holding device, the first coat layer may have a thickness of 0.3 μm to 60 μm. When such a configuration is employed, the thickness of the first coat layer is not excessively small (0.3 μm or greater). Therefore, by virtue of presence of the first coat layer, it is possible to more reliably suppress formation of an altered layer on the surface of the electricity supply connection member. Also, when such a configuration is employed, since the thickness of the first coat layer is not excessively large (60 μm or less), it is possible to reduce stress which is produced in the first coat layer due to the difference in linear expansion between the electricity supply connection member and the first coat layer. As a result, it is possible to prevent occurrence of a situation in which a crack is developed in the first coat layer due to the stress and formation of the altered layer cannot be suppressed.

(4) The above-described holding device may be configured such that at least a portion of a surface of the heating resistor element, excluding its contact surface for contact with the electricity supply connection member, is covered with a third coat layer formed of a nitride containing at least one of Al, Ti, Zr, V, Ta, and Nb. When such a configuration is employed, by virtue of the presence of the third coat layer covering the surface of the heating resistor element, it is possible to suppress formation of an altered layer on the surface of the heating resistor element during firing of the ceramic member, which altered layer is formed as a result of the heating resistor element reacting with an impurity (impurities). Thus, it is possible to suppress occurrence of a variation in the amount of heat generated by the heating resistor element due to a variation in the resistance of the heating resistor element. As a result, it is possible to suppress a variation in the temperature of the first surface of the ceramic member (and thus, the temperature of the object held on the first surface). Also, since the third coat layer is formed of a nitride containing at least one of Al, Ti, Zr, V, Ta, and Nb, during high temperature firing, the third coat layer has heat resistance, and element diffusion into the ceramic member whose main component is aluminum nitride is less likely to occur. Accordingly, when such a configuration is employed, while a change in the characteristics of the ceramic member due to the element diffusion from the third coat layer can be suppressed, presence of the third coat layer having high heat resistance makes it possible to suppress formation of an altered layer on the surface of the heating resistor element, and thus to suppress a variation in the resistance (heat generation amount) of the heating resistor element. As a result, it is possible to suppress a variation in the temperature of the first surface of the ceramic member (and thus, the temperature of the object held on the first surface).

(5) A method of manufacturing a holding device disclosed in the present specification is used for manufacturing a holding device which comprises a ceramic member having a first surface and formed of a sintered ceramic material containing aluminum nitride as a main component, a heating resistor element formed of a metal and disposed in the ceramic member, an electrically conductive electricity supply connection member in contact with the heating resistor element, and an electrically conductive electricity supply terminal electrically connected to the electricity supply connection member and which holds an object on the first surface of the ceramic member. The method comprises the steps of forming a coat layer which is a nitride containing at least one of Al, Ti, Zr, V, Ta, and Nb on at least a portion of a surface of the electricity supply connection member, excluding its contact surface for contact with the heating resistor element and its connection surface for connection with the electricity supply terminal; and forming, through firing, the ceramic member in which the heating resistor element and the electricity supply connection member having the coat layer formed thereon are disposed. In the present holding device manufacturing method, by virtue of the presence of the coat layer covering the surface of the electricity supply connection member, it is possible to suppress formation of an altered layer on the surface of the electricity supply connection member during firing of the ceramic member, which altered layer is formed as a result of the electricity supply connection member reacting with an impurity (impurities). Thus, it is possible to suppress occurrence of a connection failure between the electricity supply connection member and the heating resistor element or between the electricity supply connection member and the electricity supply terminal, and occurrence of a variation in the amount of heat generated by the heating resistor element due to a variation in the resistance of the electricity supply connection member. As a result, it is possible to suppress a variation in the temperature of the first surface of the ceramic member (and thus, the temperature of the object held on the first surface). Also, since the coat layer is formed of a nitride containing at least one of Al, Ti, Zr, V, Ta, and Nb, during high temperature firing, the coat layer has heat resistance, and element diffusion into the ceramic member whose main component is aluminum nitride is less likely to occur. Accordingly, in the present holding device manufacturing method, while a change in the characteristics of the ceramic member due to the element diffusion from the coat layer is suppressed, presence of the coat layer having high heat resistance makes it possible to suppress formation of an altered layer on the surface of the electricity supply connection member. Thus, it is possible to suppress occurrence of a connection failure between the electricity supply connection member and the heating resistor element or between the electricity supply connection member and the electricity supply terminal, and occurrence of a variation in the amount of heat generated by the heating resistor element due to a variation in the resistance of the electricity supply connection member. As a result, it is possible to suppress a variation in the temperature of the first surface of the ceramic member (and thus, the temperature of the object held on the first surface).

Notably, the technique disclosed in the present specification can be realized in various aspects. For example, the technique can be realized as a holding device, a heating device, a component for a semiconductor manufacturing apparatus, or a method of manufacturing the device or the component.

BRIEF DESCRIPTION OF DRAWINGS

FIG. 5 is an explanatory table showing the results of the performance evaluation; and FIG. 6 is an explanatory table showing the results of the performance evaluation.

DESCRIPTION OF EMBODIMENTS

A. Embodiment

Figure 1:
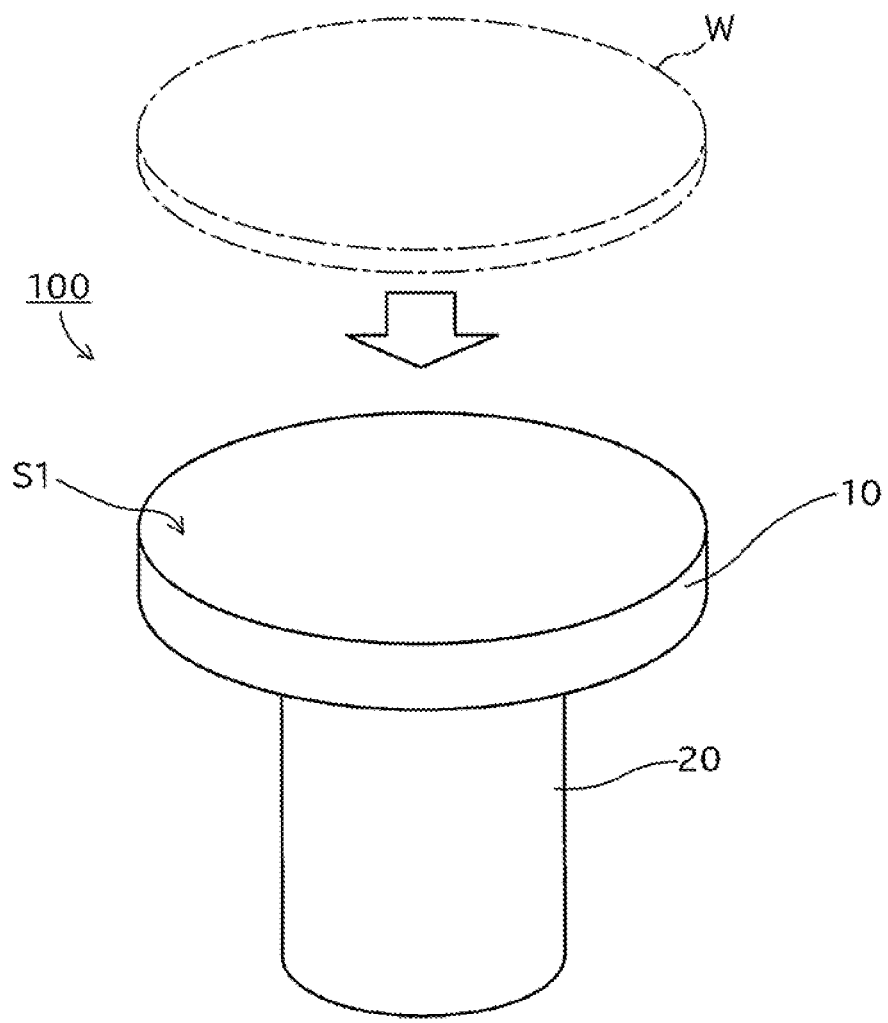
FIG. 1 is a perspective view schematically showing an external structure of a heating device 100 according to a present embodiment.
Figure 2:
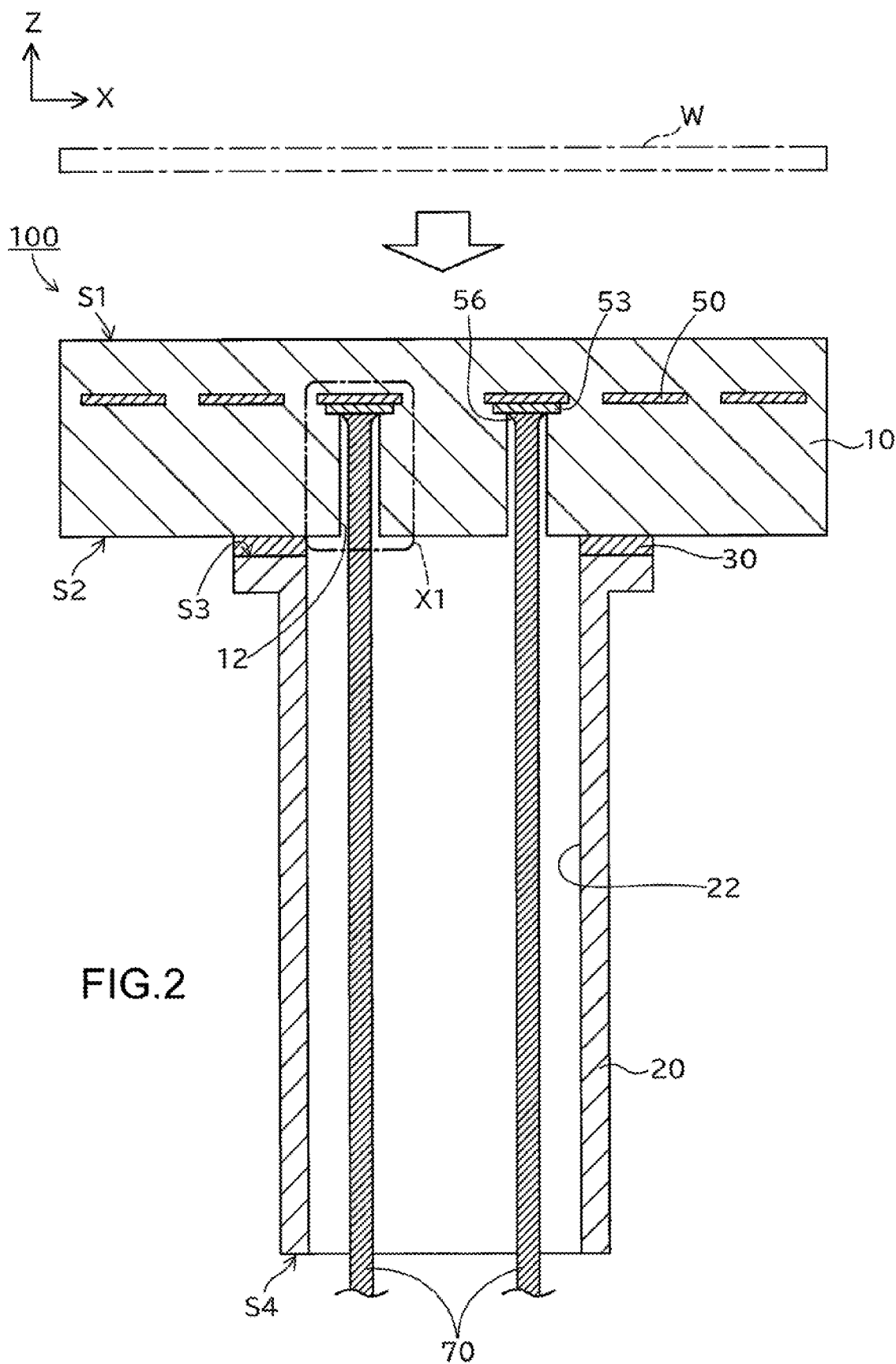
FIG. 2 is an explanatory view schematically showing an XZ cross-sectional structure of the heating device 100 according to the present embodiment.
Figure 3:
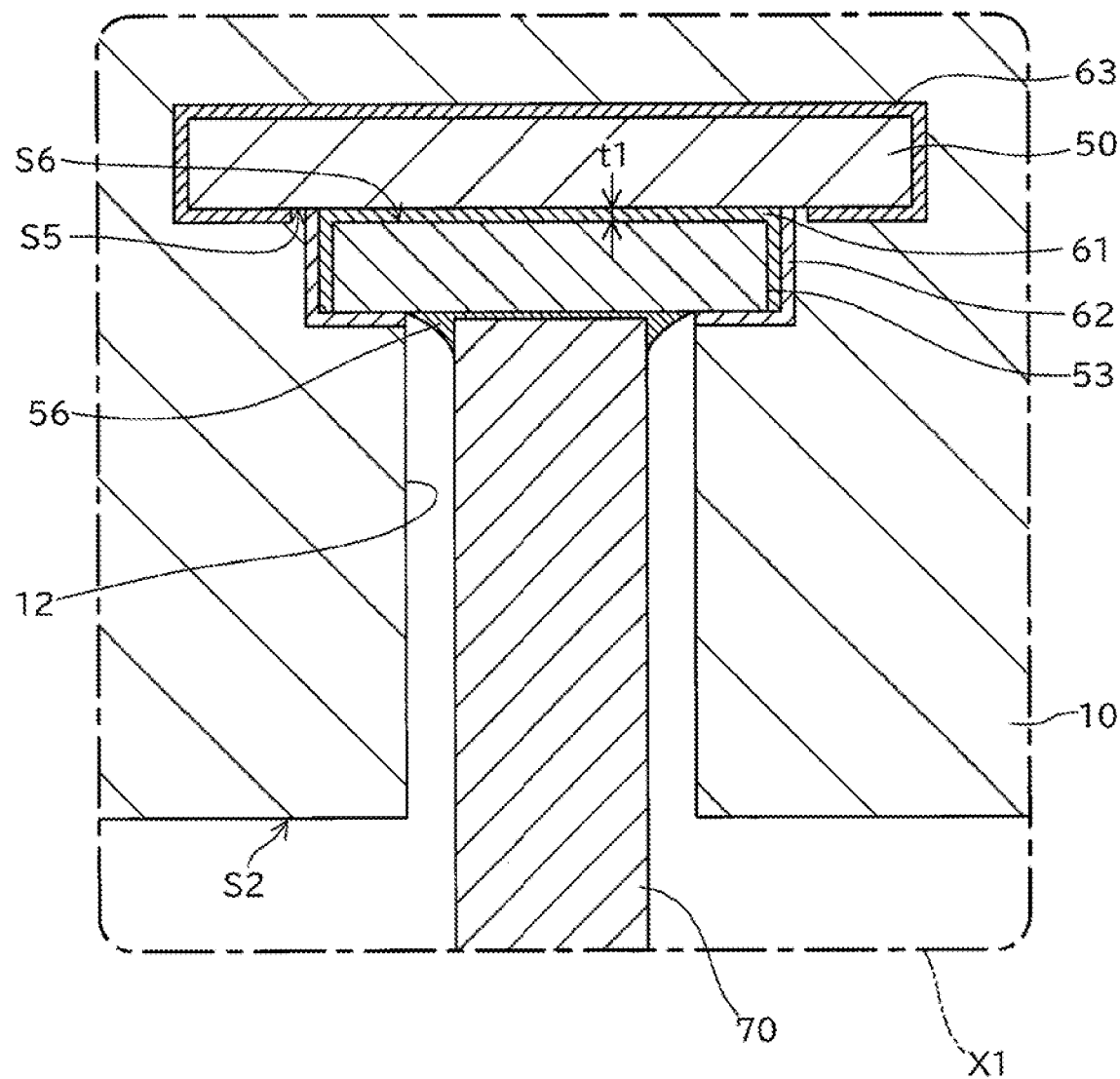
FIG. 3 is an explanatory view showing, on an enlarged scale, the XZ cross-sectional structure of the heating device 100 in a portion X1 of FIG. 2.

A-1. Structure of a Heating Device 100:

FIG. 1 is a perspective view schematically showing an external structure of a heating device 100 according to a present embodiment. FIG. 2 is an explanatory view schematically showing an XZ cross-sectional structure of the heating device 100 according to the present embodiment. FIG. 3 is an explanatory view showing, on an enlarged scale, the XZ cross-sectional structure of the heating device 100 in a portion X1 of FIG. 2. Mutually orthogonal X, Y, and Z axes for specifying directions are shown in these figures. In the present specification, a positive Z-axis direction is referred to as an upward direction, and a negative Z-axis direction is referred to as a downward direction, for the sake of convenience. However, in actuality, the heating device 100 may be disposed with an orientation different from such an orientation.

The heating device 100 is a device for heating an object (for example, a semiconductor wafer W) to a predetermined temperature (for example, about 400 to 800° C.) while holding the object and is also called a "susceptor". The heating device 100 is used, for example, as a component which constitutes a semiconductor manufacturing apparatus such as a film formation apparatus (a CVD film formation apparatus, a sputtering film formation apparatus, etc.) or an etching apparatus (a plasma etching apparatus, etc.). The heating device 100 is an example of the holding device in the claims.

As shown in FIGS. 1 and 2, the heating device 100 includes a holding member 10 and a support member 20.

The holding member 10 is an approximately disc-shaped member having a surface (hereinafter referred to as the "holding surface") S1 approximately perpendicular to the Z-axis direction (the vertical direction) and a surface (hereinafter referred to as the "back surface") S2 on the side opposite the holding surface S1. The holding member 10 is formed of a sintered ceramic material containing aluminum nitride (AlN) as a main component. Notably, in the present specification, the "main component" means a component whose content ratio (weight ratio) is the largest. The diameter of the holding member 10 is, for example, about 100 mm to 500 mm, and the thickness (dimension in the Z-axis direction) of the holding member 10 is, for example, about 3 mm to 30 mm. The holding member 10 is an example of the ceramic member in the claims, and the holding surface S1 is an example of the first surface in the claims.

As shown in FIGS. 2 and 3, a pair of recesses 12 corresponding to a pair of terminal members 70 and a pair of electricity receiving electrodes 53 which will be described later are formed in the back surface S2 of the holding member 10. The shape of a cross section (XY cross section) of each recess 12 perpendicular to the Z-axis direction is, for example, approximately circular.

The support member 20 is a member having an approximately circular tubular shape and extending in the Z-axis direction. The support member 20 is formed of a sintered ceramic material which contains, for example, aluminum nitride or alumina ($Al_2O_3$) as a main component. The outer diameter of the support member 20 is, for example, about 30 mm to 90 mm, and the height (dimension in the Z-axis direction) of the support member 20 is, for example, about 100 mm to 300 mm.

As shown in FIG. 2, the support member 20 has a through hole 22 formed therein and extending in the Z-axis direction from the upper surface S3 of the support member 20 to the lower surface S4 of the support member 20. The shape of a cross section (XY cross section) of the through hole 22 perpendicular to the Z-axis direction is, for example, approximately circular. The inner diameter of the through hole 22 is, for example, about 10 mm to 70 mm.

As shown in FIG. 2, the holding member 10 and the support member 20 are disposed such that the back surface S2 of the holding member 10 and the upper surface S3 of the support member 20 face each other in the Z-axis direction and the holding member 10 and the support member 20 are approximately coaxial with each other. The holding member 10 and the support member 20 are joined to each other via a joining portion 30 formed of a well known joining material.

As shown in FIG. 2, a heating resistor element 50 serving as a heater for heating the holding member 10 is disposed in the holding member 10. The heating resistor element 50 forms, for example, a pattern extending generally spirally as viewed in the Z-axis direction. The heating resistor element 50 is formed of, for example, a metal such as tungsten (W) or molybdenum (Mo). The diameter of the entire heating resistor element 50 as viewed in the Z-axis direction is, for example, about 70 mm to 450 mm. The line width of the heating resistor element 50 as viewed in the Z-axis direction is, for example, about 0.1 mm to 10 mm. The thickness (size in the Z-axis direction) of the heating resistor element 50 is, for example, about 0.1 mm to 3 mm.

As shown in FIGS. 2 and 3, a pair of electricity receiving electrodes 53 are disposed in the holding member 10. Each electricity receiving electrode 53 is a plate member having an approximately circular shape as viewed in the Z-axis direction. Each electricity receiving electrode 53 is formed of, for example, an electrically conductive material such as tungsten or molybdenum. The thickness of each electricity receiving electrode 53 is, for example, about 0.1 mm to 5 mm. In the present embodiment, the electricity receiving electrode 53 is an example of the electricity supply connection member in the claims.

One of the paired electricity receiving electrodes 53 is exposed to the bottom surface of one of the paired recesses 12 formed in the back surface S2 of the holding member 10 and is in contact, through its upper surface S6, with a lower surface S5 of the heating resistor element 50, which forms a generally spiral pattern, at a position near an one end thereof, so that the one electricity receiving electrode 53 is electrically connected to the heating resistor element 50. Similarly, the other of the paired electricity receiving electrodes 53 is exposed to the bottom surface of the other of the paired recesses 12 formed in the back surface S2 of the holding member 10 and is in contact, through its upper surface S6, with the lower surface S5 of the heating resistor element 50 at a position near the other end thereof, so that the other electricity receiving electrode 53 is electrically connected to the heating resistor element 50.

As shown in FIGS. 2 and 3, a pair of terminal members 70 are disposed in the through hole 22 formed in the support member 20. Each terminal member 70 is, for example, a member having an approximately circular columnar shape. Each terminal member 70 is formed of, for example, an electrically conductive material such as nickel or titanium. The diameter of the terminal members 70 is, for example, about 3 mm to 8 mm. In the present embodiment, the terminal member 70 is an example of the electricity supply terminal in the claims.

An upper end portion of one of the paired terminal members 70 is received in one of the paired recesses 12 formed in the back surface S2 of the holding member 10, and is joined, through a brazing portion 56, to the corresponding electricity receiving electrode 53 exposed to the bottom surface of the recess 12. Similarly, an upper end portion of the other of the paired terminal members 70 is received in the other of the paired recesses 12 formed in the back surface S2 of the holding member 10, and is joined, through another brazing portion 56, to the corresponding electricity receiving electrode 53 exposed to the bottom surface of the recess 12. Each of the brazing portions 56 is formed through use of, for example, a metal brazing material such as an Ni alloy (e.g., Ni—Cr-based alloy), an Au alloy (e.g., Au—Ni-based alloy), or pure Au. Each of the terminal members 70 is electrically connected to the electricity receiving electrode 53 through the brazing portion 56.

The heating device 100 having such a structure operates as follows. When a voltage is applied from an unillustrated power supply to the heating resistor element 50 through the terminal members 70 and the electricity receiving electrodes 53, the heating resistor element 50 generates heat. As a result, the object (for example, the semiconductor wafer W) held on the holding surface S1 of the holding member 10 is heated to a predetermined temperature (for example, about 400 to 800° C.). Notably, in the heating device 100 of the present embodiment, since the terminal members 70 are connected to the heating resistor element 50 through the electricity receiving electrodes 53, stress produced due to the difference in thermal expansion between the terminal members 70 and the heating resistor element 50 can be mitigated.

A-2. Specific Structures of the Electricity Receiving Electrodes 53, the Heating Resistor Element 50, and their Vicinity:

Next, the specific structures of the electricity receiving electrodes 53, the heating resistor element 50, and their vicinity will be described with reference to FIG. 3.

In the heating device 100 of the present embodiment, a first coat layer 61 covers at least a portion of a contact surface of each electricity receiving electrode 53 which is a part of the surface thereof and is for contact with the heating resistor element 50. More specifically, the first coat layer 61 covers the greater part (for example, 80% or greater) of the contact surface of each electricity receiving electrode 53 for contact with the heating resistor element 50. The first coat layer 61 is formed of a nitride containing at least one of Ti, Zr, V, Cr, Ta, and Nb and has electrical conductivity. Namely, the first coat layer 61 is formed of, for example, ZrN, TiN, (Al,Ti)N, (Al,Cr)N, VN, (Ti,Cr)N, (Al,Ti,Cr)N, (Al,Ti,Si)N, TaN, NbN, or the like. The thickness t1 of the first coat layer 61 is preferably 0.3 µm to 60 µm, more preferably, 1.0 µm to 50 µm. The porosity of the first coat layer 61 is preferably 30% or less, more preferably 10% or less. Notably, in the present specification, the expression "the contact surface of each electricity receiving electrode 53 which is a part of the surface thereof and is for contact with the heating resistor element 50" means a part of the surface of each electricity receiving electrode 53, which part faces the heating resistor element 50 directly or via another member (for example, the first coat layer 61).

In the heating device 100 of the present embodiment, a second coat layer 62 covers at least a portion of the surface of each electricity receiving electrode 53, excluding its contact surface for contact with the heating resistor element 50 and its connection surface for connection with the corresponding terminal member 70. More specifically, the second coat layer 62 covers the greater part (for example, 80% or greater) of the surface of each electricity receiving electrode 53, excluding the contact surface for contact with the heating resistor element 50 and the connection surface for connection with the corresponding terminal member 70. The second coat layer 62 is formed of a nitride containing at least one of Al, Ti, Zr, V, Ta, and Nb. Namely, the second coat layer 62 is formed of, for example, AlN, TiN, ZrN, (Al,Ti)N, (Al,Ti,Si)N, (Al,Ti,Cr)N, (Al,Cr)N, VN, TaN, NbN, or the like. The thickness of the second coat layer 62 is preferably 0.3 µm to 60 µm. The porosity of the second coat layer 62 is preferably 30% or less, more preferably 10% or less. Notably, in the present specification, the expression "the connection surface of each electricity receiving electrode 53 which is a part of the surface thereof and is for connection with the corresponding terminal member 70" means a part of the surface of each electricity receiving electrode 53, which part faces the corresponding terminal member 70, or the corresponding brazing portion 56 joining the electricity receiving electrode 53 and the corresponding terminal member 70, directly or via another member.

Notably, the expression "the second coat layer 62 covers at least a portion of the surface of each electricity receiving electrode 53, excluding its contact surface for contact with the heating resistor element 50 and its connection surface for connection with the corresponding terminal member 70" means that, when attention is paid to the surface of each electricity receiving electrode 53, excluding the contact surface for contact with the heating resistor element 50 and the connection surface for connection with the corresponding terminal member 70, a portion or the entirety of the surface is covered by the second coat layer 62 and does not exclude an embodiment in which the second coat layer 62 covers partially or entirely the contact surface of each electricity receiving electrode 53 for contact with the heating resistor element 50 and/or the connection surface of each electricity receiving electrode 53 for connection with the corresponding terminal member 70. Notably, in the case where the second coat layer 62 is electrically conductive (for example, in the case where the second coat layer 62 is formed of a nitride containing at least one of Ti, Zr, V, Ta, and Nb), the second coat layer 62 does not adversely affect the electrical continuity between the electricity receiving electrodes 53 and the heating resistor element 50 and/or the electrical continuity between the electricity receiving electrodes 53 and the terminal members 70 even when the second coat layer 62 covers partially or entirely the contact surface of each electricity receiving electrode 53 for contact with the heating resistor element 50 and/or the connection surface of each electricity receiving electrode 53 for connection with the corresponding terminal member 70. However, in the case where the second coat layer 62 is not electrically conductive (for example, in the case where the second coat layer 62 is formed of AlN), in order to secure the electrical continuity between the electricity receiving electrodes 53 and the heating resistor element 50 and/or the electrical continuity between the electricity receiving electrodes 53 and the terminal members 70, it is preferred that the second coat layer 62 does not cover at least a portion of the contact surface of each electricity receiving electrode 53 for contact with the heating resistor element 50 and/or the connection surface of each electricity receiving electrode 53 for connection with the corresponding terminal member 70.

Since element B, C, and O may react with the electricity receiving electrode 53 formed of Mo or W, preferably, the first coat layer 61 and the second coat layer 62 do not contain element B, C, and O.

In the case where the same material is used to form the first coat layer 61 and the second coat layer 62 (namely, both of the layers are electrically conductive), formation of the first coat layer 61 and the second coat layer 62 on the surface of each electricity receiving electrode 53 does not require a special process (for example, a process of masking regions where electrical continuity must be secured), and the first coat layer 61 and the second coat layer 62 can be formed in the same step. Therefore, it is possible to simplify the manufacturing process and reduce costs.

In the heating device 100 of the present embodiment, a third coat layer 63 covers at least a portion of the surface of the heating resistor element 50, excluding its contact surfaces for contact with the electricity receiving electrode 53. More specifically, the third coat layer 63 covers the greater part (for example, 80% or greater) of the surface of the heating resistor element 50, excluding its contact surfaces for contact with the electricity receiving electrode 53. The third coat layer 63 is formed of a nitride containing at least one of Al, Ti, Zr, V, Ta, and Nb. Namely, the third coat layer 63 is formed of, for example, AlN, TiN, ZrN, (Al,Ti)N, (Al,Ti,Si)N, (Al,Ti,Cr)N, (Al,Cr)N, VN, TaN, NbN, or the like. The thickness of the third coat layer 63 is preferably 0.3 µm to 60 µm. The porosity of the third coat layer 63 is preferably 30% or less, more preferably 10% or less. Notably, in the present specification, the expression "the contact surfaces of the heating resistor element 50 which are parts of the surface thereof and are for contact with the electricity receiving electrodes 53" means parts of the surface of the heating resistor element 50, which parts face the electricity receiving electrodes 53 directly or via another member (for example, the first coat layer 61).

Notably, the expression "the third coat layer 63 covers at least a portion of the surface of the heating resistor element 50, excluding its contact surfaces for contact with the electricity receiving electrode 53" means that, when attention is paid to the surface of the heating resistor element 50, excluding its contact surfaces for contact with the electricity receiving electrode 53, a portion or the entirety of the surface is covered by the third coat layer 63 and does not exclude an embodiment in which the third coat layer 63 covers partially or entirely the contact surfaces of the heating resistor element 50 for contact with the electricity receiving electrodes 53. Notably, in the case where the third coat layer 63 is electrically conductive (for example, in the case where the third coat layer 63 is formed of a nitride containing at least one of Ti, Zr, V, Ta, and Nb), the third coat layer 63 does not adversely affect the electrical continuity between the heating resistor element 50 and the electricity receiving electrode 53 even when the third coat layer 63 covers partially or entirely the contact surfaces of the heating resistor element 50 for contact with the electricity receiving electrodes 53. However, in the case where the third coat layer 63 is not electrically conductive (for example, in the case where the third coat layer 63 is formed of AlN), in order to secure the electrical continuity between the heating resistor element 50 and the electricity receiving electrode 53, it is preferred that the third coat layer 63 does not cover at least a portion of the contact surface of the heating resistor element 50 for contact with the electricity receiving electrodes 53.

Since element B, C, and O may react with the heating resistor element 50 formed of Mo or W, preferably, the third coat layer 63 does not contain element B, C, and O.

Figure 4:
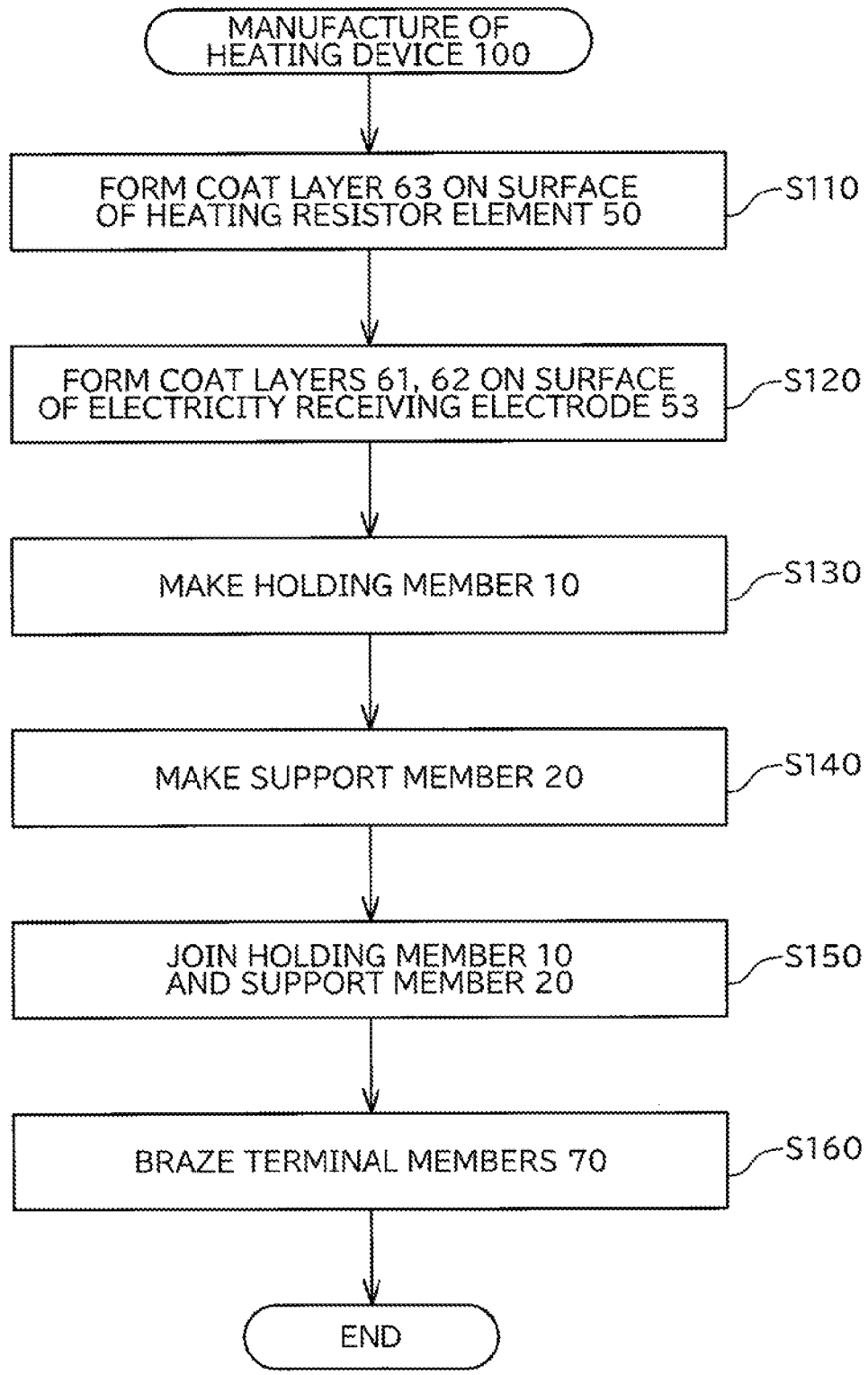
FIG. 4 is a flowchart showing an example of the method of manufacturing the heating device 100 of the present embodiment.

A-3. Method of Manufacturing the Heating Device 100:

A method of manufacturing the heating device 100 of the present embodiment is, for example, as follows. FIG. 4 is a flowchart showing an example of the method of manufacturing the heating device 100 of the present embodiment. First, the heating resistor element 50 formed of a mesh or foil of a metal (for example, tungsten or molybdenum) is prepared. Subsequently, the third coat layer 63, which is a nitride containing at least one of Al, Ti, Zr, V, Ta, and Nb is formed on at least a portion of the surface of the heating resistor element 50, excluding its contact surfaces for contact with the electricity receiving electrodes 53 (in the present embodiment, on the greater part of the surface of the heating resistor element 50, excluding its contact surfaces for contact with the electricity receiving electrodes 53) (S110). Notably, the third coat layer 63 is formed, for example, by performing thermal spraying, sputtering, CVD, PVD, or the like while masking the regions of the surface of the heating resistor element 50 where the third coat layer 63 is not formed.

Also, the electricity receiving electrodes 53 formed of, for example, a plate-shaped electrically conductive material (for example, tungsten or molybdenum) are prepared, and the electrically conductive first coat layer 61, which is a nitride containing at least one of Ti, Zr, V, Cr, Ta, and Nb is formed on at least a portion of the contact surface of each electricity receiving electrode 53 for contact with the heating resistor element 50 (in the present embodiment, on the greater part of the contact surface for contact with the heating resistor element 50) (S120). Also, the second coat layer 62, which is a nitride containing at least one of Al, Ti, Zr, V, Ta, and Nb is formed on at least a portion of the surface of each electricity receiving electrode 53, excluding the contact surface for contact with the heating resistor element 50 (in the present embodiment, on the greater part of the surface, excluding the contact surface for contact with the heating resistor element 50) (S120). Namely, the second coat layer 62 is also formed on the connection surface of each electricity receiving electrode 53 which is a part of the surface thereof and is for connection with the corresponding terminal member 70. Notably, the first coat layer 61 is formed, for example, by performing thermal spraying, sputtering, CVD, PVD, or the like while masking a region of the surface of each electricity receiving electrode 53 where the first coat layer 61 is not formed. Similarly, the second coat layer 62 is formed, for example, by performing thermal spraying, sputtering, CVD, PVD, or the like while masking a region of the surface of each electricity receiving electrode 53 where the second coat layer 62 is not formed.

Also, the holding member 10 is made, for example, as follows (S130). Namely, a material powder mixture containing aluminum nitride powder (for example, 95 parts by weight) and an appropriate amount (for example, 5 parts by weight) of optional yttrium oxide powder added thereto is charged into a die and is pressed uniaxially, whereby a first layer of a compact is formed. The heating resistor element 50 having the third coat layer 63 formed thereon and the electricity receiving electrodes 53 having the first coat layer 61 and the second coat layer 62 formed thereon are disposed on the first layer such that the heating resistor element 50 comes into contact with the electricity receiving electrodes 53 (through the first coat layer 61). Next, the above-mentioned material powder mixture is charged on the heating resistor element 50 and the electricity receiving electrodes 53 so as to form a second layer of the compact such that the second layer has a predetermined thickness. The compact prepared in the above-described manner is hot-press fired under predetermined conditions (for example, temperature: about 1,700° C. to 1,900° C., pressure: about 1 MPa to 20 MPa, time: about 1 hour to 5 hours), whereby the holding member 10 having the heating resistor element 50 and the electricity receiving electrodes 53 disposed therein is fabricated.

The recesses 12 in the back surface S2 of the holding member 10 are formed by, for example, grinding work performed on the holding member 10 by using a grinding tool after the above-described hot-press firing. This grinding work is performed until the electricity receiving electrodes 53 are exposed. As a result of this grinding work, a portion of the second coat layer 62 formed on the surface of each electricity receiving electrode 53, which portion is formed on the contact surface thereof for contact with the corresponding terminal member 70, is removed, and the surface of the electricity receiving electrode 53 is exposed in the region where the second coat layer 62 is removed. Notably, it is preferred to render the thickness of the electricity receiving electrodes 53 greater than the thickness of the heating resistor element 50, to thereby prevent damage (e.g., cracking) to the electricity receiving electrode 53 even when the electricity receiving electrodes 53 are ground slightly by the grinding tool during the grinding work for formation of the recesses 12.

Also, the support member 20 is made, for example, as follows (S140). A mixture is prepared by adding an appropriate amount (for example, 1 part by weight) of optional yttrium oxide powder, PVA as a binder (for example, 3 parts by weight), a dispersant, and a plasticizer to aluminum nitride powder (for example, 100 parts by weight). An organic solvent such as methanol is added to the mixture, and the resultant mixture is mixed by a ball mill so as to obtain a slurry. This slurry is granulated by a spray drier, whereby a material powder is prepared. This material powder is cold-isostatic pressed under a predetermined pressure (for example, 100 MPa to 250 MPa), whereby a compact is obtained. Notably, the through hole 22 of the support member 20 may be formed by using a rubber die during the molding or may be formed through machining after molding or firing. The obtained compact is debindered in air at, for example, 600° C., and the debindered compact is suspended in an nitrogen gas atmosphere within a furnace and is fired under predetermined conditions (for example, temperature: about 1,800° C. to 1,900° C., time: about 4 hours to 6 hours), whereby the support member 20 is fabricated.

Next, the holding member 10 and the support member 20 are joined together (S150). Namely, a known joining material such as a complex oxide of, for example, an alkaline earth metal, a rare earth element, and aluminum is mixed with an organic solvent or the like to prepare a paste. After lapping the back surface S2 of the holding member 10 and the upper surface S3 of the support member 20 when necessary, the paste is applied uniformly on at least one the back surface S2 of the holding member 10 and the upper surface S3 of the support member 20, and a debindering process is performed. Subsequently, the back surface S2 of the holding member 10 and the upper surface S3 of the support member 20 are mated together, and the assembly of the holding member 10 and the support member 20 is hot-press fired under predetermined conditions (for example, temperature: about 1,400° C. to 1,850° C., pressure: about 0.5 MPa to 10 MPa) in vacuum or a depressurized inert gas (e.g., nitrogen gas or argon gas). As a result, the joining portion 30 for joining the holding member 10 and the support member 20 is formed.

Next, the terminal members 70 are inserted into the through hole 22 of the support member 20, and the upper end portions of the terminal members 70 are brazed to the electricity receiving electrodes 53, whereby the brazing portions 56 are formed (S160). The heating device 100 having the above-described structure is manufactured mainly by the manufacturing method as described above.

A-4. Effects of the Present Embodiment:

As described above, the heating device 100 of the present embodiment is a holding device which includes the holding member 10 having the holding surface S1 and formed of a sintered ceramic material containing aluminum nitride as a main component, the heating resistor element 50 formed of a metal and disposed in the holding member 10, the electrically conductive electricity receiving electrodes 53 in contact with the heating resistor element 50, and the electrically conductive terminal members 70 electrically connected to the electricity receiving electrodes 53 and which holds an object such as a semiconductor wafer W on the holding surface S1 of the holding member 10. In the heating device 100 of the present embodiment, at least a portion of the surface of each electricity receiving electrode 53, excluding its contact surface for contact with the heating resistor element 50 and its connection surface for connection with the corresponding terminal member 70, is covered with the second coat layer 62, which is formed of a nitride containing at least one of Al, Ti, Zr, V, Ta, and Nb.

As described above, during manufacture of the heating device 100 of the present embodiment, the compact of the material of the holding member 10 in which the material of the heating resistor element 50 and the material of the electricity receiving electrodes 53 are disposed is fired at high temperature (for example, about 1,700° C. to 1,900° C.), whereby the holding member 10 formed of a dense sintered ceramic material, the heating resistor element 50 disposed in the holding member 10, and the electricity receiving electrodes 53 disposed in the holding member 10 are made. During the firing, an impurity (impurities) (for example, carbon) originating from raw materials or the atmosphere within a furnace may enter the compact of the material of the holding member 10 before being densified and react with the electricity receiving electrodes 53, thereby forming altered layers (for example, a tungsten carbide layer or a molybdenum carbide layer) on the surfaces of the electricity receiving electrodes 53. If altered layers are formed on the surfaces of the electricity receiving electrodes 53, a connection failure may occur between the electricity receiving electrodes 53 and the heating resistor element 50 or between the electricity receiving electrodes 53 and the terminal members 70. Also, a variation in the amount of heat generated by the heating resistor element 50 due to a variation in the resistance of each electricity receiving electrode 53 occurs. This may result in occurrence of a variation in the temperature of the holding surface S1 of the holding member 10 (and thus, the temperature of the object (such as the semiconductor wafer W) held on the holding surface S1).

However, in the heating device 100 of the present embodiment, by virtue of the presence of the second coat layer 62 covering the surface of each electricity receiving electrode 53, it is possible to suppress formation of an altered layer on the surface of each electricity receiving electrode 53 during the firing of the holding member 10, which altered layer is formed as a result of the electricity receiving electrode 53 reacting with the an impurity (impurities). Thus, it is possible to suppress occurrence of a connection failure between the electricity receiving electrodes 53 and the heating resistor element 50 or between the electricity receiving electrodes 53 and the terminal members 70, and occurrence of a variation in the amount of heat generated by the heating resistor element 50 due to a variation in the resistance of each electricity receiving electrode 53. Also, since the second coat layer 62 formed on the surface of each electricity receiving electrode 53 is formed of a nitride containing at least one of Al, Ti, Zr, V, Ta, and Nb, during high temperature firing, the second coat layer 62 has heat resistance, and element diffusion into the holding member 10 whose main component is aluminum nitride is less likely to occur.

Accordingly, in the heating device 100 of the present embodiment, while a change in the characteristics of the holding member 10 due to the element diffusion from the second coat layer 62 is be suppressed, presence of the second coat layer 62 having high heat resistance makes it possible to suppress formation of an altered layer on the surface of each electricity receiving electrode 53. As result, it is possible to suppress occurrence of a connection failure between the electricity receiving electrodes 53 and the heating resistor element 50 or between the electricity receiving electrodes 53 and the terminal members 70, and occurrence of a variation in the amount of heat generated by the heating resistor element 50 due to a variation in the resistance of each electricity receiving electrode 53.

Notably, in the case where the second coat layer 62 is electrically conductive (for example, in the case where the second coat layer 62 is formed of a nitride containing at least one of Ti, Zr, V, Ta, and Nb), it is unnecessary to perform a special process (for example, a process of masking regions where electrical continuity must be secured (for example, the contact surface which is a part of the surface of the electricity receiving electrodes 53 and is provided for contact with the heating resistor element 50 and/or the connection surface which is a part of the surface of the electricity receiving electrodes 53 and is provided for connection with the terminal member 70) when the second coat layer 62 is formed on the surface of the electricity receiving electrodes 53. Therefore, it is possible to simplify the manufacturing process and reduce costs. In the case where the second coat layer 62 is formed of AlN, the difference in thermal expansion between the second coat layer 62 and the holding member 10 and the difference in thermal expansion between the second coat layer 62 and the electricity receiving electrodes 53 become relatively small. Therefore, occurrence of cracking of the second coat layer 62 can be prevented even when the thickness of the second coat layer 62 is made relatively large.

Also, in the heating device 100 of the present embodiment, at least a portion of the contact surface of each electricity receiving electrode 53, which is a part of the surface thereof and is for contact with the heating resistor element 50, is covered with the first coat layer 61, which is formed of a nitride containing at least one of Ti, Zr, V, Cr, Ta, and Nb. By virtue of the presence of the first coat layer 61 covering the surface of each electricity receiving electrode 53, it is possible to suppress formation of an altered layer on the surface of each electricity receiving electrode 53 during the firing of the holding member 10, which altered layer is formed as a result of the electricity receiving electrode 53 reacting with the an impurity (impurities). Thus, it is possible to suppress occurrence of a connection failure between the electricity receiving electrodes 53 and the heating resistor element 50 or between the electricity receiving electrodes 53 and the terminal members 70, and occurrence of a variation in the amount of heat generated by the heating resistor element 50 due to a variation in the resistance of each electricity receiving electrode 53. Also, since the first coat layer 61 formed on the contact surface of each electricity receiving electrode 53 which is a part of the surface thereof and is for contact with the heating resistor element 50 is formed of a nitride containing at least one of Ti, Zr, V, Cr, Ta, and Nb. Therefore, during high temperature firing, the first coat layer 61 has heat resistance, and element diffusion into the holding member 10 whose main component is aluminum nitride is less likely to occur. Further, since the first coat layer 61 is electrically conductive, the first coat layer 61 can secure the electrical connection between the electricity receiving electrodes 53 and the heating resistor element 50. Accordingly, in the heating device 100 of the present embodiment, while hindrance to the electrical connection between the electricity receiving electrodes 53 and the heating resistor element 50 by the first coat layer 61 is avoided and a change in the characteristics of the holding member 10 due to the element diffusion from the first coat layer 61 is suppressed, presence of the first coat layer 61 having high heat resistance makes it possible to effectively suppress formation of an altered layer on the surface of each electricity receiving electrode 53. As a result, it is possible to suppress occurrence of a connection failure between the electricity receiving electrodes 53 and the heating resistor element 50 or between the electricity receiving electrodes 53 and the terminal members 70, and occurrence of a variation in the amount of heat generated by the heating resistor element 50 due to a variation in the resistance of each electricity receiving electrode 53.

Also, in the heating device 100 of the present embodiment, at least a portion of the surface of the heating resistor element 50, excluding its contact surfaces for contact with the electricity receiving electrode 53, is covered with the third coat layer 63, which is formed of a nitride containing at least one of Al, Ti, Zr, V, Ta, and Nb. By virtue of the presence of the third coat layer 63 covering the surface of the heating resistor element 50, it is possible to suppress formation of an altered layer on the surface of the heating resistor element 50 during the firing of the holding member 10, which altered layer is formed as a result of the heating resistor element 50 reacting with the an impurity (impurities). Thus, it is possible to suppress occurrence of a variation in the amount of heat generated by the heating resistor element 50 due to a variation in the resistance of the heating resistor element 50. Also, since the third coat layer 63 is formed of a nitride containing at least one of Al, Ti, Zr, V, Ta, and Nb, during high temperature firing, the third coat layer 63 has heat resistance, and element diffusion into the holding member 10 whose main component is aluminum nitride is less likely to occur. Accordingly, in the heating device 100 of the present embodiment, while a change in the characteristics of the holding member 10 due to the element diffusion from the third coat layer 63 can be suppressed, presence of the third coat layer 63 having high heat resistance makes it possible to suppress formation of the altered layer on the surface of the heating resistor element 50, and thus to suppress a variation in the resistance (heat generation amount) of the heating resistor element 50.

Notably, in the case where the third coat layer 63 is electrically conductive (for example, in the case where the third coat layer 63 is formed of a nitride containing at least one of Ti, Zr, V, Ta, and Nb), it is unnecessary to perform a special process (for example, a process of masking regions where electrical continuity must be secured (for example, contact surfaces which are parts of the surface of the heating resistor element 50 and are provided for contact with the electricity receiving electrodes 53) when the third coat layer 63 is formed on the surface of the heating resistor element 50. Therefore, it is possible to simplify the manufacturing process and reduce costs. In the case where the third coat layer 63 is formed of AlN, the difference in thermal expansion between the third coat layer 63 and the holding member 10 and the difference in thermal expansion between the third coat layer 63 and the heating resistor element 50 become relatively small. Therefore, occurrence of cracking of the third coat layer 63 can be prevented even when the thickness of the third coat layer 63 is made relatively large.

Notably, the thickness t1 of the first coat layer 61 is preferably 0.3 µm to 60 µm. When such a configuration is employed, the thickness t1 of the first coat layer 61 is not excessively small (0.3 µm or greater). Therefore, by virtue of presence of the first coat layer 61, it is possible to more reliably suppress formation of the altered layer on the surface of the electricity receiving electrodes 53. Also, when such a configuration is employed, since the thickness t1 of the first coat layer 61 is not excessively large (60 µm or less), it is possible to reduce the stress which is produced in the first coat layer 61 due to the difference in linear expansion between the electricity receiving electrodes 53 and the first coat layer 61. As a result, it is possible to prevent occurrence of a situation in which a crack is developed in the first coat layer 61 due to the stress and formation of the altered layer cannot be suppressed. Notably, from the viewpoint of more reliably suppressing the formation of altered layers on the surfaces of the electricity receiving electrodes 53, it is more preferable that the thickness t1 of the first coat layer 61 is 1.0 µm or greater.

A-5. Method of Analyzing the Heating Device 100:

A-5-1. Method of Determining the Thickness t1 of the First Coat Layer 61:

A method of determining the thickness t1 of the first coat layer 61 formed on the surface of the electricity receiving electrodes 53 is as follows.

After a cross section containing a contact part of the electricity receiving electrodes 53 for contact with the heating resistor element 50 (cross section parallel to the Z-axis direction) is mirror-polished, the mirror-polished cross section is subjected to a cross section polisher treatment for treating a cross section of a sample by means of an ion beam (e.g., argon ion beam). Next, the treated cross section is photographed and observed in 10 fields of view by using an electron probe micro analyzer (EPMA). Notably, the field of elemental mapping is 100 μm×100 μm. Next, by using an image analysis software program (Analysis Five which is a product of Soft Imaging System GmbH), the position of the interface between the electricity receiving electrodes 53 and the first coat layer 61 and the position of the interface between the heating resistor element 50 and the first coat layer 61 are confirmed and lines are drawn therealong. In each of view images, the shortest distance between the lines drawn along the two interfaces is determined as the thickness t1 of the first coat layer 61. The average of the thicknesses t1 of the first coat layer 61 determined in the 10 view images is finally employed as the thickness t1 of the first coat layer 61.

A-5-2. Method of Determining Whether or not a Coat Layer Formed of AlN is Present:

In the case where the second coat layer 62 is formed of AlN (i.e., the case where the second coat layer 62 is formed of the same material as the holding member 10), the covering of each electricity receiving electrode 53 with the second coat layer 62 of AlN can be determined as follows.

After a cross section containing the electricity receiving electrode 53 (cross section parallel to the Z-axis direction) is mirror-polished, the mirror-polished cross section is subjected to a cross section polisher treatment for treating a cross section of a sample by means of an ion beam (e.g., argon ion beam). Next, the treated cross section is photographed and observed in a designated field of view by using a scanning electron microscope (SEM). Notably, the treated cross section is photographed in the following two types of fields of view; i.e., 5 fields of view of a first type and 5 fields of view of a second type.

(1) Fields of view having a size of 100 μm×100 μm and including the interface between the electricity receiving electrode 53 and the holding member 10
(2) Fields of view having a size of 1 mm×1 mm and including the interface between the electricity receiving electrode 53 and the holding member 10

When the following two requirements are satisfied, the electricity receiving electrode 53 is judged to be covered with the second coat layer 62 of AlN.

Requirement 1: when the diameters of pores at the interface between the electricity receiving electrode 53 and the holding member 10 and the number of the pores are determined, through observation, in each of the 10 view images of the above-mentioned fields of view (1), the number of pores whose diameters are 0.5 μm to 3 μm is two or more on average, and diffusion of an element of a component(s) not contained in the holding member 10 and the electricity receiving electrode 53 is not observed.

Requirement 2: when the distribution of the grain boundary phase component in the above-mentioned fields of view (2) is observed, of the 10 view images, at least 5 view images do not include a region where the grain boundary phase component is contained in a small amount in the vicinity of the interface between the electricity receiving electrode 53 and the holding member 10 (within a 100 μm range from the interface).

Usually, an oxide present on the surface of a member made of a metal such as W or Mo (hereinafter referred to as "metal surface oxide") and an oxide present on the surface of each AlN grain form a liquid phase at low temperature and lead to densification. Therefore, pores are less likely to be formed at the interface. Also, when sintering proceeds, the grain boundary phase component of AlN is discharged to an unsintered region. Therefore, a difference in the concentration of the grain boundary phase component is produced.

Meanwhile, in the case where the second coat layer 62 formed of AlN is present on the surface, since the liquid-phase forming reaction at low temperature caused by the reaction between the metal surface oxide and the oxide on the surface of each AlN grain of the holding member 10 does not occur, the interface pores are likely to remain. Also, since a difference in sintering behavior is less likely to be produced between the vicinity of the interface and other locations, the difference in the density of the grain boundary phase component is less likely to be produced. Therefore, when the above-described two requirements are satisfied, it is possible to judge that the electricity receiving electrode 53 is covered with the second coat layer 62 of AlN.

Notably, in the case where the third coat layer 63 is formed of AlN (i.e., the case where the third coat layer 63 is formed of the same material as the holding member 10), the covering of the heating resistor element 50 with the third coat layer 63 of AlN can also be determined by the same method.

B. Performance Evaluation

Performance evaluation was performed in terms of achievement of the above-mentioned effects through employment of the above-described structure of the heating device 100. The performance evaluation will now be described. FIGS. 5 and 6 are explanatory tables showing the results of the performance evaluation.

As shown in FIGS. 5 and 6, 26 samples (SA1 to SA26) of the heating device were used for the performance evaluation. Each sample was manufactured by a manufacturing method according to the method of manufacturing the heating device 100 of the above-described embodiment. The samples differ from one another in terms of the material of the electricity receiving electrodes 53, the presence/absence, material, and thickness t1 of the first coat layer 61 on the surface of each electricity receiving electrode 53, the presence/absence and material of the second coat layer 62 on the surface of each electricity receiving electrode 53, and the presence/absence and material of the third coat layer 63 on the surface of the heating resistor element 50.

Specifically, in samples SA1 to SA12, SA15, SA16, and SA18 to SA26, the first coat layer 61 was formed on the surface of each electricity receiving electrode 53 as in the above-described embodiment, and in samples SA13, SA14, and SA17, the first coat layer 61 was not formed on the surface of each electricity receiving electrode 53. Notably, as shown in FIGS. 5 and 6, in samples SA1 to SA12, SA15, SA16, and SA18 to SA26, a nitride containing at least one of Ti, Zr, V, Cr, Ta, and Nb was used to form the first coat layer 61. Also, in samples SA1 to SA12 and SA15 to SA26, the second coat layer 62 was formed on the surface of each electricity receiving electrode 53 as in the above-described embodiment, and in samples SA13 and SA14, the second coat layer 62 was not formed on the surface of each electricity receiving electrode 53. Notably, as shown in FIGS. 5 and 6, in samples SA1 to SA12 and SA15 to SA26, a nitride containing at least one of Al, Ti, Zr, V, Ta, and Nb was used to form the second coat layer 62. In each sample, the thickness of the second coat layer 62 was set to 5 μm. Also, in samples SA11, SA12, and SA26, the third coat layer 63 was formed on the surface of the heating resistor element 50 as in the above-described embodiment, and in samples SA1 to SA10 and SA13 to SA25, the third coat layer 63 was not formed on the surface of the heating resistor element 50. Notably, in samples SA11 and SA12, AlN was used to form the third coat layer 63, and in sample SA26, ZrN was used to form the third coat layer 63. In each sample, the thickness of the third coat layer 63 was set to 3 μm.

For each sample, a variation in the temperature of the holding surface S1 of the holding member 10 was measured as part of the performance evaluation. More specifically, a blackened dummy wafer was placed on the holding surface S1 of the holding member 10 of each heating device sample, the temperature of the heating device sample was increased by supplying electric power to the heating resistor element 50 through the terminal members 70, and the surface temperature of the dummy wafer was measured. After the electric power supplied through the terminal members 70 was maintained at the same level for 15 minutes from a point when the surface temperature of the dummy wafer had reached 500° C., the maximum temperature difference within the dummy wafer was measured as the temperature variation of the holding surface S1.

Also, for each sample, a heat resistance test was performed as part of the performance evaluation. More specifically, each sample was heated to 600° C., and presence/absence of coming off of the terminal members 70 and presence/absence of a crack in the holding member 10 were checked after elapsed of 50 hours and after elapsed of 100 hours.

As shown in FIGS. 5 and 6, in samples SA13 and SA14 in which the second coat layer 62 was not formed on the surface of each electricity receiving electrode 53, coming off of the terminal members 70 occurred in the 600° C., 50-hour heat resistance test. Also, in these samples, the temperature variation (temperature difference) of the holding surface S1 was 10° C. or greater, which is relatively large. In these samples, since the second coat layer 62 was not present on the surface of the electricity receiving electrode 53, during the firing of the holding member 10, conceivably, an impurity (impurities) originating from raw materials or the atmosphere within a furnace entered the compact of the material of the holding member 10 before being densified and reacted with the electricity receiving electrode 53, with resultant formation of a relatively thick altered layer on the surface of the electricity receiving electrode 53. As a result, conceivably, a connection failure occurred between the electricity receiving electrode 53 and the terminal member 70, and a variation in the amount of heat generated by the heating resistor element 50 due to a variation in the resistance of the electricity receiving electrode 53 occurred, whereby a variation in the temperature of the holding surface S1 occurred. Notably, in sample SA13 among these samples, development of a crack in the holding member 10 at a position near the position of contact between the holding member 10 and a corner portion of one electricity receiving electrode 53 was observed in the 600° C., 50-hour heat resistance test. In this sample, conceivably, since a relatively large amount of an altered layer greatly different in thermal expansion from AlN (the material used to form the holding member 10) was formed on the surfaces of the electricity receiving electrodes 53, a crack was developed in the holding member 10 due to the difference in thermal expansion between the holding member 10 and the altered layer.

In contrast, in samples SA1 to SA12 and SA15 to SA26, in which the second coat layer 62 was formed on the surface of each electricity receiving electrode 53, coming off of the terminal members 70 did not occur in the 600° C., 50-hour heat resistance test. Also, in these samples, the temperature variation (temperature difference) of the holding surface S1 was 9° C. or less, which is relatively small. In sample SA17 among these samples, although the first coat layer 61 was not formed on the surface of each electricity receiving electrode 53, coming off of the terminal members 70 did not occur in the 600° C., 50-hour heat resistance test. Also, in this sample, the temperature variation (temperature difference) of the holding surface S1 was 9° C. or less, which is relatively small. In these samples, conceivably, the presence of the second coat layer 62 on the surface of the electricity receiving electrodes 53 suppressed formation of the altered layer on the surface of the electricity receiving electrodes 53 during the firing of the holding member 10, the altered layer being formed as a result of the electricity receiving electrodes 53 reacting with an impurity (impurities). As a result, conceivably, occurrence of a connection failure between the electricity receiving electrodes 53 and the terminal member 70 and occurrence of a variation in the amount of heat generated by the heating resistor element 50 due to a variation in the resistance of the electricity receiving electrodes 53 were suppressed. Notably, in these samples, development of a crack in the holding member 10 was not observed in the 600° C., 50-hour heat resistance test. In these samples, conceivably, since formation of an altered layer greatly different in thermal expansion from AlN (the material used to form the holding member 10) on the surfaces of the electricity receiving electrodes 53 was suppressed, development of a crack in the holding member 10 due to the difference in thermal expansion between the holding member 10 and the altered layer was suppressed.

The following was confirmed from the results of this performance evaluation. In the case where at least a portion of the surface of each electricity receiving electrode 53, excluding its contact surface for contact with the heating resistor element 50 and its connection surface for connection with the corresponding terminal member 70 is covered with the second coat layer 62 formed of a nitride containing at least one of Al, Ti, Zr, V, Ta, and Nb, formation of an altered layer on the surface of each electricity receiving electrode 53 can be suppressed. Thus, it is possible to suppress occurrence of a connection failure between the electricity receiving electrodes 53 and the heating resistor element 50 or between the electricity receiving electrodes 53 and the terminal members 70. Also, it is possible to suppress occurrence of a variation in the amount of heat generated by the heating resistor element 50 due to a variation in the resistance of each electricity receiving electrode 53. As a result, a variation in the temperature of the holding surface S1 of the holding member 10 can be suppressed.

Notably, in samples SA11, SA12, and SA26 in which the third coat layer 63 was formed on the surface of the heating resistor element 50 and which are among samples SA1 to SA12 and SA15 to SA26 in which the second coat layer 62 was formed on the surface of each electricity receiving electrode 53, the temperature variation (temperature difference) of the holding surface S1 was 4° C. or less, which is extremely small. In these samples, conceivably, the presence of the third coat layer 63 on the surface of the heating resistor element 50 suppressed formation of the altered layer on the surface of the heating resistor element 50 during the firing of the holding member 10, the altered layer being formed as a result of the heating resistor element 50 reacting with an impurity (impurities). As a result, conceivably, occurrence of a variation in the amount of heat generated by the heating resistor element 50 due to a variation in the resistance of the heating resistor element 50 were suppressed. From the results of this performance evaluation, it was confirmed that at least a portion of the surface of the heating resistor element 50, excluding its contact surfaces for contact with the electricity receiving electrodes 53, is preferably covered with the third coat layer 63 formed of a nitride containing at least one of Al, Ti, Zr, V, Ta, and Nb.

Also, of samples SA1 to SA12, SA15, SA16, and SA18 to SA26 in which the first coat layer 61 was formed on the surface of each electricity receiving electrode 53, samples SA1 and SA15 in which the thickness t1 of the first coat layer 61 was less than 0.3 μm and samples SA2 and SA16 in which the thickness t1 of the first coat layer 61 was greater than 60 μm did not exhibit coming off of the terminal members 70 in the 600° C., 50-hour heat resistance test as described above. However, in these samples, coming off of the terminal members 70 occurred in the more severe 600° C., 100-hour heat resistance test. In contrast, in samples SA3 to SA12 and SA18 to SA26 in which the thickness t1 of the first coat layer 61 was 0.3 μm to 60 μm, coming off of the terminal members 70 did not occur even in the 600° C., 100-hour heat resistance test. In the case of samples SA3 to SA12 and SA18 to SA26, since the thickness t1 of the first coat layer 61 is not excessively small (0.3 μm or greater), conceivably, formation of the altered layer on the surface of the electricity receiving electrode 53 can be suppressed more reliably by the first coat layer 61 present on the surface of the electricity receiving electrode 53. Also, since the thickness t1 of the first coat layer 61 is not excessively large (60 μm or less), conceivably, it is possible to reduce the stress which is produced in the first coat layer 61 due to the difference in linear expansion between the electricity receiving electrode 53 and the first coat layer 61, thereby preventing occurrence of a situation in which a crack is developed in the first coat layer 61 due to the stress and formation of the altered layer cannot be suppressed. It was confirmed from the results of this performance evaluation that the thickness t1 of the first coat layer 61 is preferably 0.3 μm to 60 μm.

C. Modifications

The technique disclosed in the present specification is not limited to the above-described embodiments, and can be implemented in various forms without departing from its gist. For example, the following modifications are possible.

The structures of the heating devices 100 in the above-described embodiments are mere examples and can be modified in various ways. For example, in the above-described embodiment, the electricity receiving electrodes 53 are joined to the terminal members 70 by means of the brazing portions 56. However, in order to mitigate the stress produced due to the difference in thermal expansion between the electricity receiving electrodes 53 and the terminal members 70, buffering members formed of, for example, a metal such as Kovar may be disposed between the electricity receiving electrodes 53 and the terminal members 70.

In the above-described embodiment, the first coat layer 61 covers the greater part (for example, 80% or greater) of the contact surface of each electricity receiving electrode 53, which is a part of the surface thereof and is for contact with the heating resistor element 50. However, it is sufficient that the first coat layer 61 covers at least a portion of the contact surface of each electricity receiving electrode 53, which is a part of the surface thereof and is for contact with the heating resistor element 50. Formation of the first coat layer 61 may be omitted. Similarly, in the above-described embodiment, the second coat layer 62 covers the greater part (for example, 80% or greater) of the surface of each electricity receiving electrode 53, excluding its contact surface for contact with the heating resistor element 50 and its connection surface for connection with the corresponding terminal member 70. However, it is sufficient that the second coat layer 62 covers at least a portion of the surface of each electricity receiving electrode 53, excluding its contact surface for contact with the heating resistor element 50 and its connection surface for connection with the corresponding terminal member 70. Similarly, in the above-described embodiment, the third coat layer 63 covers the greater part (for example, 80% or greater) of the surface of the heating resistor element 50, excluding its contact surfaces for contact with the electricity receiving electrodes 53. However, it is sufficient that the third coat layer 63 covers at least a portion of the surface of the heating resistor element 50, excluding its contact surfaces for contact with the electricity receiving electrodes 53. Also, formation of the third coat layer 63 may be omitted.

In the above-described embodiment, one heating resistor element 50 is disposed in the holding member 10. However, a plurality of heating resistor elements 50 may be disposed in the holding member 10. In such a structure, there are provided a plurality of sets each of which includes the electricity receiving electrodes 53 and the terminal members 70 and which correspond to the plurality of heating resistor elements 50.

The shape, number, forming material, etc. of each member constituting each of the heating devices 100 of the above-described embodiment are mere examples and can be changed variously. Also, the method of manufacturing the heating device 100 in the above-described embodiment is a mere example and can be changed variously.

In the above-described embodiment, the structure of the heating device 100 is described in detail. However, the technique disclosed in the present specification can be similarly applied to a general holding device which includes a ceramic member formed of a sintered ceramic material containing aluminum nitride as a main component, a heating resistor element formed of a metal and disposed in the ceramic member, an electrically conductive electricity supply connection member in contact with the heating resistor element, and an electrically conductive electricity supply terminal electrically connected to the electricity supply connection member, and which holds an object on the surface of the ceramic member.

DESCRIPTION OF REFERENCE NUMERALS AND SYMBOLS

10: holding member 12: recess 20: support member 22: through hole 30: joining portion 50: heating resistor element 53: electricity receiving electrode 56: brazing portion 61: first coat layer 62: second coat layer 63: third coat layer 70: terminal member 100: heating device S1: holding surface S2: back surface S3: upper surface S4: lower surface S5: lower surface S6: upper surface W: semiconductor wafer

The invention claimed is:
1. A holding device comprising:
    a ceramic member having a first surface and formed of a sintered ceramic material containing aluminum nitride as a main component;
    a heating resistor element formed of a metal and disposed in the ceramic member;
    an electricity supply connection member which is entirely embedded inside the ceramic member, is electrically conductive, and is in contact with the heating resistor element; and
    an electricity supply terminal which is electrically conductive, is electrically connected to the electricity supply connection member, and extends to outside of the ceramic member;

the holding device being adapted to hold an object on the first surface of the ceramic member and being characterized in that at least a portion of a surface of the electricity supply connection member, excluding a contact surface of the electricity supply connection member for contact with the heating resistor element and a connection surface of the electricity supply connection member for connection with the electricity supply terminal, is covered with a second coat layer formed of a nitride selected from the group consisting of AlN, AlTiN, AlTiSiN, AlZrN, AlTiCrN, VN, and NbN, wherein the electricity supply connection member is in the form of a plate having a circular shape, the electricity supply terminal is in the form of a column having a circular shape, at least a portion of the contact surface of the electricity supply connection member for contact with the heating resistor element is covered with a first coat layer formed of a nitride containing at least one selected from the group consisting of Ti, Zr, V, Cr, Ta, and Nb, and the first coat layer has a thickness of 0.3 μm to 60 μm.

2. The holding device according to claim 1, wherein at least a portion of a surface of the heating resistor element, excluding its contact surface for contact with the electricity supply connection member, is covered with a third coat layer formed of a nitride containing at least one of Al, Ti, Zr, V, Ta, and Nb.

3. The holding device according to claim 1, wherein a material of the first coat layer has a different chemical composition than a material of the second coat layer.

4. The holding device of claim 1, wherein the electricity supply connection member is formed of tungsten or molybdenum.

5. The holding device of claim 4, wherein the electricity supply terminal is formed of nickel or titanium.

6. The holding device of claim 1, wherein the electricity supply terminal is formed of nickel or titanium.

7. A method of manufacturing a holding device which comprises a ceramic member having a first surface and formed of a sintered ceramic material containing aluminum nitride as a main component, a heating resistor element formed of a metal and disposed in the ceramic member, an electrically conductive electricity supply connection member which is entirely embedded inside the ceramic member and is in contact with the heating resistor element, and an electrically conductive electricity supply terminal which is electrically connected to the electricity supply connection member and extends outside of the ceramic member, and which holds an object on the first surface of the ceramic member, the method being characterized by comprising the steps of:

forming a second coat layer which is a nitride selected from the group consisting of AlN, AlTiN, AlTiSiN, AlZrN, AlTiCrN, VN, and NbN on at least a portion of a surface of the electricity supply connection member, excluding a contact surface of the electricity supply connection member for contact with the heating resistor element and a connection surface of the electricity supply connection member for connection with the electricity supply terminal; and forming, through firing, the ceramic member in which the heating resistor element and the electricity supply connection member having the coat layer formed thereon are disposed, wherein the electricity supply connection member is in the form of a plate having a circular shape, the electricity supply terminal is in the form of a column having a circular shape, wherein the method further comprises forming a first coat layer which is a nitride containing at least one selected from the group consisting of Ti, Zr, V, Cr, Ta, and Nb on at least a portion of the contact surface of the electricity supply connection member for contact with the heating resistor element, and wherein the first coat layer has a thickness of 0.3 μm to 60 μm.

8. The holding device of claim 7, wherein the electricity supply connection member is formed of tungsten or molybdenum, and the electricity supply terminal is formed of nickel or titanium.

* * * * *